United States Patent

Zhao et al.

[11] Patent Number: 5,993,916
[45] Date of Patent: Nov. 30, 1999

[54] METHOD FOR SUBSTRATE PROCESSING WITH IMPROVED THROUGHPUT AND YIELD

[75] Inventors: Jun Zhao, Cupertino; Lee Luo, Fremont; Xiao Liang Jin, Sunnyvale, all of Calif.

[73] Assignee: Applied Materials, Inc., Santa Clara, Calif.

[21] Appl. No.: 08/936,285

[22] Filed: Sep. 22, 1997

Related U.S. Application Data

[63] Continuation-in-part of application No. 08/680,724, Jul. 12, 1996, Pat. No. 5,846,332, and a continuation-in-part of application No. 08/857,847, May 16, 1997.
[60] Provisional application No. 60/059,256, Sep. 18, 1997.
[51] Int. Cl.⁶ ..................................................... C23C 16/34
[52] U.S. Cl. .......................... 427/535; 117/104; 117/952; 427/255.28; 427/255.394
[58] Field of Search ....................... 427/255.28, 255.394, 427/535; 117/104, 952

[56] References Cited

U.S. PATENT DOCUMENTS

| | | |
|---|---|---|
| 4,951,601 | 8/1990 | Maydan et al. . |
| 5,366,585 | 11/1994 | Robertson et al. . |
| 5,558,717 | 9/1996 | Zhao et al. . |
| 5,566,744 | 10/1996 | Tepman ................................ 118/724 X |
| 5,834,068 | 11/1998 | Chern et al. ............................ 427/535 |

FOREIGN PATENT DOCUMENTS 714 998 A2   6/1996   European Pat. Off. .

OTHER PUBLICATIONS

"CVD Titanium Nitride TxZ," Metal CVD Liner TxZ Centura, Applied Materials, Inc., printed in Sep. 1996.
"Liner TxZ Centura," Metal CVD TxZ Liner Centura, Applied Materials, Inc., printed in Dec. 1996.

*Primary Examiner*—Leo B. Tentoni
*Attorney, Agent, or Firm*—Townsend & Townsend

[57] ABSTRACT

The present invention provides an approach which provides an increase in the number of usable substrates with a film, such as titanium nitride, deposited thereon at a sufficient deposition rate and where the film meets uniformity and resistivity specifications as well as providing good step coverage. In accordance with an embodiment, the present invention provides a method of substrate processing. The method includes steps of circulating a heat exchange medium through a passage in a chamber body of a vacuum chamber, and heating a heater pedestal having a surface for supporting the substrate to a heater temperature. The heat exchange medium has a heat exchange temperature of about 60° C. or less. The method also includes the step of flowing at a flow rate a gas into the chamber to deposit a film on a substrate, where the flow rate provides an effective temperature of the substrate lower than the heater temperature and where the film meets uniformity and resistance specifications after deposition onto a number of substrates. This number is less than twenty-five, in some embodiments, and less than ten in other embodiments. The use of the present invention thus avoids the discarding of the initial hundreds of processed substrates not meeting specifications that is typically experienced with the prior art processes.

13 Claims, 11 Drawing Sheets

METHOD FOR SUBSTRATE PROCESSING WITH IMPROVED THROUGHPUT AND YIELD

CROSS-REFERENCE TO RELATED APPLICATIONS

This application is a continuation-in-part of commonly assigned U.S. patent application No. 08/680,724 entitled "COMPONENTS PERIPHERAL TO THE PEDESTAL IN THE GAS FLOW PATH WITHIN A CHEMICAL VAPOR DEPOSITION CHAMBER", (Attorney Docket No. AMAT1495) filed on Jul. 12, 1996 now U.S. Pat. No. 5,846,332 and having Jun Zhao, Ashok Sinha, Avi Tepman, Mei Chang, Lee Luo, Alex Schreiber, Talex Sajoto, Stefan Wolff, Charles Dornfest, and Michael Danek listed as co-inventors, the disclosure of which is hereby incorporated by reference for all purposes; and a continuation-in-part of commonly assigned U.S. patent application No. 08/857,847 entitled "REMOVABLE PUMPING CHANNEL LINER WITH A CHEMICAL VAPOR DEPOSITION CHAMBER", (Attorney Docket No. AMAT1495/D1) filed on May 16, 1997 and having Jun Zhao, Ashok Sinha, Avi Tepman, Mei Chang, Lee Luo, Alex Schreiber, Talex Sajoto, Stefan Wolff, Charles Dornfest, and Michael Danek listed as co-inventors, the disclosure of which is hereby incorporated by reference for all purposes; and claims priority from commonly assigned U.S. provisional patent application No. 60/059,256 entitled "METHODS AND APPARATUS FOR SUBSTRATE PROCESSING WITH IMPROVED THROUGHPUT AND YIELD" (Attorney Docket No. AMAT1495/P1/T21200) filed on Sep. 18, 1997 and having listed Jun Zhao, Lee Luo, Xiao Liang Jin, listed as co-inventors, the disclosure of which is hereby incorporated by reference for all purposes.

BACKGROUND OF THE INVENTION

The present invention relates to semiconductor processing, and more specifically, to methods and apparatus for substrate processing with improved throughput and yield. In some specific embodiments, the invention is particularly useful for forming titanium-containing films such as titanium nitride at heater temperatures of greater than about 400° C. Such films may be used as patterned conductive layers, plugs between conductive layers, diffusion barrier layers, and adhesion layers. In addition, other embodiments of the present invention may be used, for example, to deposit other types of metal films, to alloy substrate materials, and to anneal substrate materials.

One of the primary steps in fabricating modern semiconductor devices is forming various layers, including dielectric layers and metal layers, on a semiconductor substrate. As is well known, these layers can be deposited by chemical vapor deposition (CVD) or physical vapor deposition (PVD). In a conventional thermal CVD process, reactive gases are supplied to the substrate surface where heat-induced chemical reactions (homogeneous or heterogeneous) take place to produce a desired film. In a conventional plasma CVD process, a controlled plasma is formed to decompose and/or energize reactive species to produce the desired film. In general, reaction rates in thermal and plasma processes may be controlled by controlling one or more of the following: temperature, pressure, plasma density, reactant gas flow rate, power frequency, power levels, chamber physical geometry, and others. In an exemplary PVD system, a target (a plate of the material that is to be deposited) is connected to a negative voltage supply (direct current (DC) or radio frequency (RF)) while a substrate holder facing the target is either grounded, floating, biased, heated, cooled, or some combination thereof. A gas, such as argon, is introduced into the PVD system, to provide a medium in which a glow discharge can be initiated and maintained. When the glow discharge is started, positive ions strike the target, and target atoms are removed by momentum transfer. These target atoms subsequently condense into a thin film on the substrate, which is on the substrate holder.

In modern semiconductor fabrication, the efficient manufacturing of substrates having devices with increasingly smaller features (e.g., 0.25 $\mu$m and smaller) and higher integration density is becoming a growing concern, as the industry seeks to economically produce devices which meet increasingly stringent performance requirements. For example, such devices have features, such as gaps, (with high aspect ratios of, for example, about 7:1 or greater for 0.3 $\mu$m feature size devices; where aspect ratio is defined as the height-to-spacing ratio of two adjacent steps) that need to be adequately filled with a uniformly deposited layer in many applications. Being able to deposit uniform films at sufficient deposition rates also is important in producing as many usable substrates with such devices as possible. In addition, it is desirable to increase substrate throughput and yield of usable substrates.

As is well recognized, efficiency issues and device performance problems often arise due to unwanted depositions from repeatedly processing substrates to deposit the desired film. For example, unwanted deposits that have bonded poorly to an underlying chamber component or that have built up on the heater may result in flakes and other particles that fall onto the substrate and cause defects on the substrate, thus reducing substrate yield. For these and other reasons, the chamber must periodically be cleaned (in some applications) with "dry" clean processes, which do not require opening of the chamber. The chamber is cleaned with a less frequent "wet" or preventive maintenance clean, which requires at least partially disassembling the chamber to manually clean with solvents various parts of the chamber. The dry cleaning process may use reactive gas or plasma species to etch unwanted deposits from the chamber components, or may physically bombard particles with plasma species to knock them loose, to be removed by the exhaust system. The wet cleaning process, which may be done in addition or as an alternative to a dry clean, typically involves at least partial disassembly of the chamber, which is then wiped down with solvents. In many processes such as, for example, metal depositions of titanium-containing films, the time required for cleaning the chamber becomes a major factor affecting the deposition system's wafer output. Subsequent to the preventive maintenance clean, the chamber must be reassembled and may be "seasoned", i.e., a number of deposition cycles must be performed until consistent layers are obtained. Both cleaning procedures take the deposition system out of productive operation, which is inefficient and uneconomic, albeit necessary.

Despite use of wet cleanings, prior titanium nitride processes have been limited in substrate throughput and yield, since the initial 100–300 substrates deposited after the first use of or a preventive maintenance cleaning of the deposition chamber failed to meet acceptable device requirements. For example, a thermal CVD process using vaporized TDMAT has been used for conformally coating titanium nitride (TiN) in a narrow hole or gap. In the TDMAT process, a precursor gas of tetrakis-dimethylamido-titanium, $Ti(N(CH_4)_2)_4$, is injected into the chamber (an exemplary chamber is shown in FIG. 1A) through a showerhead 40 at a pressure of about 1 to 9 torr while the pedestal 32 holds the substrate 36 (partially shown) at an elevated temperature of about 360° C. or higher. Thereby, a conductive and conformal TiN layer is deposited on the substrate 36 in a CVD process. The TDMAT process is a thermal process not usually relying upon plasma excitation of the precursor gas. The TDMAT deposition process initially forming the TiN layer may be followed by a second step of plasma treating the deposited TiN layer to remove excessive amounts of carbon which degrades the TiN film's conductivity. The TDMAT gas in the chamber is replaced by an gas mixture of $H_2$ and $N_2$ in about a 50:50 ratio at a pressure of about 0.5 to 10 torr, and the RF power source 94 is switched on to create electric fields between the showerhead 40 and the pedestal 32 sufficient to discharge the $H_2:N_2$ gas to form a plasma. The hydrogen and nitrogen species in the plasma reduce the carbonaceous polymer in the TiN to volatile byproducts which are exhausted from the system, and the plasma treatment thereby removes the carbon to improve the quality of the TiN film. It is noted that during the thermal phase of the TDMAT process during which the conductive TiN is deposited, the heater 32 is heated and the heat is transferred thence to the wafer 36. In this thermal phase, the exposed portion of the pedestal 32 tends to be at a significantly higher temperature than that of the wafer 36. In particular, to raise the temperature of the wafer 36 to its processing temperature, the temperature of the pedestal 32 is raised to a higher temperature than that of the wafer 36. In this TDMAT process, the processing temperature of the wafer 36 has effectively been about 360° C. while the exposed portion of the pedestal tends to be at a significantly higher temperature of about 425° C. It should also be noted that these prior TiN TDMAT processes were performed at a chamber body temperature (or heat exchange temperature) of about 65° C. TiN films deposited on substrates processed using these prior TDMAT processes did not meet uniformity and/or resistivity specifications for the initial hundreds of substrates. The initial hundreds of processed substrates failing to meet specifications were thus discarded, resulting in the uneconomic waste of both expensive substrates and the time to process these discarded substrates. It is noted that with prior processes, chamber hardware conditions often fluctuated from when the chamber is idling to when the chamber runs a deposition process. The fluctuating chamber hardware conditions resulted in process inconsistencies which was undesirable for depositing films meeting process specifications and repeatability requirements. Accordingly, methods and apparatus for depositing the desired film having good step coverage and meeting uniformity and resistivity specifications while simultaneously increasing substrate throughput and yield in an economic and efficient manner are desired.

In light of the above, improved methods and apparatus are needed for increasing substrate throughput and yield in order to efficiently and economically produce modern semiconductor devices. Optimally, these improved methods and apparatus will be compatible with processing requirements for forming devices with high aspect ratio features.

SUMMARY OF THE INVENTION

The present invention provides an approach which provides an increase in the number of usable substrates with a film deposited thereon at a sufficient deposition rate and where the film meets uniformity and resistivity specifications as well as providing good step coverage. The present invention optimizes the heater temperature, heat exchange temperature, and the selection of gases flowed into the chamber in order to minimize the change in chamber hardware conditions from idling to processing. The present invention also provides a seasoning of the chamber by depositing a pre-coating of the deposited film in order to help minimize the number of processed substrates that fail to meet process specifications.

In accordance with an embodiment, the present invention provides a method of substrate processing. The method includes steps of circulating a heat exchange medium through a passage in a chamber body of a vacuum chamber, and heating a heater pedestal having a surface for supporting the substrate to a heater temperature. The heat exchange medium has a heat exchange temperature of about 60° C. or less. The method also includes the step of flowing at a flow rate a gas into the chamber to deposit a film on a substrate, where the flow rate provides an effective temperature of the substrate lower than the heater temperature and where the film meets uniformity and resistance specifications after deposition onto a number of substrates. This number is less than twenty-five, in some embodiments.

According to another embodiment, the present invention provides a substrate processing apparatus. The substrate processing apparatus includes a processing chamber, a gas delivery system configured to deliver a gas to the processing chamber, a heating system configured to heat a heater in the chamber to a selected heater temperature, and a heat exchange system configured to maintain portions of the chamber at a selected heat exchange temperature. The apparatus also includes a vacuum system configured to set and maintain a selected pressure within the chamber, and a controller configured to control the gas delivery system, the vacuum system, the heat exchange system, and the heating system, The apparatus further includes a memory coupled to the controller. The memory includes a computer-readable medium having a computer-readable program embodied therein for directing operation of the substrate processing apparatus. The computer-readable program includes a first set of computer instructions for controlling the heater system to heat the heater to the selected heater temperature; a second set of computer instructions for controlling the heat exchange system to maintain the heat exchange temperature at about 60° C. or less; and a third set of computer instructions for controlling the gas delivery system to flow the gas at a flow rate of about 0.4–2 liters/minute to deposit a film on the substrate, wherein the film meets uniformity and resistance specifications after deposition of less than an amount of the initial substrates processed. This amount is less than twenty-five, in some embodiments.

These and other embodiments of the present invention, as well as its advantages and features, are described in more detail in conjunction with the text below and attached figures.

DETAILED DESCRIPTION OF THE SPECIFIC EMBODIMENTS

I. CVD Reactor System

A. Overview of an Exemplary CVD Reactor

Embodiments of the present invention are methods and apparatus used for depositing films (such as a titanium nitride film) in an environment at heater temperatures of about 400–500° C. in some embodiments. Of course, such systems, methods and apparatus, as described below, may be used to deposit other films such as titanium silicide, titanium, polysilicon, metal silicides, metal nitride barriers such as tungsten nitride, or other films, in addition to a titanium nitride film. Such films may be used to form metal layers, adhesion layers, via plugs, or other layers. Specific embodiments of the present invention may be used with substrate processing apparatus such as a CVD system 10 shown in FIG. 1A, as well as with other types of substrate processing apparatus.

Figure 1A:
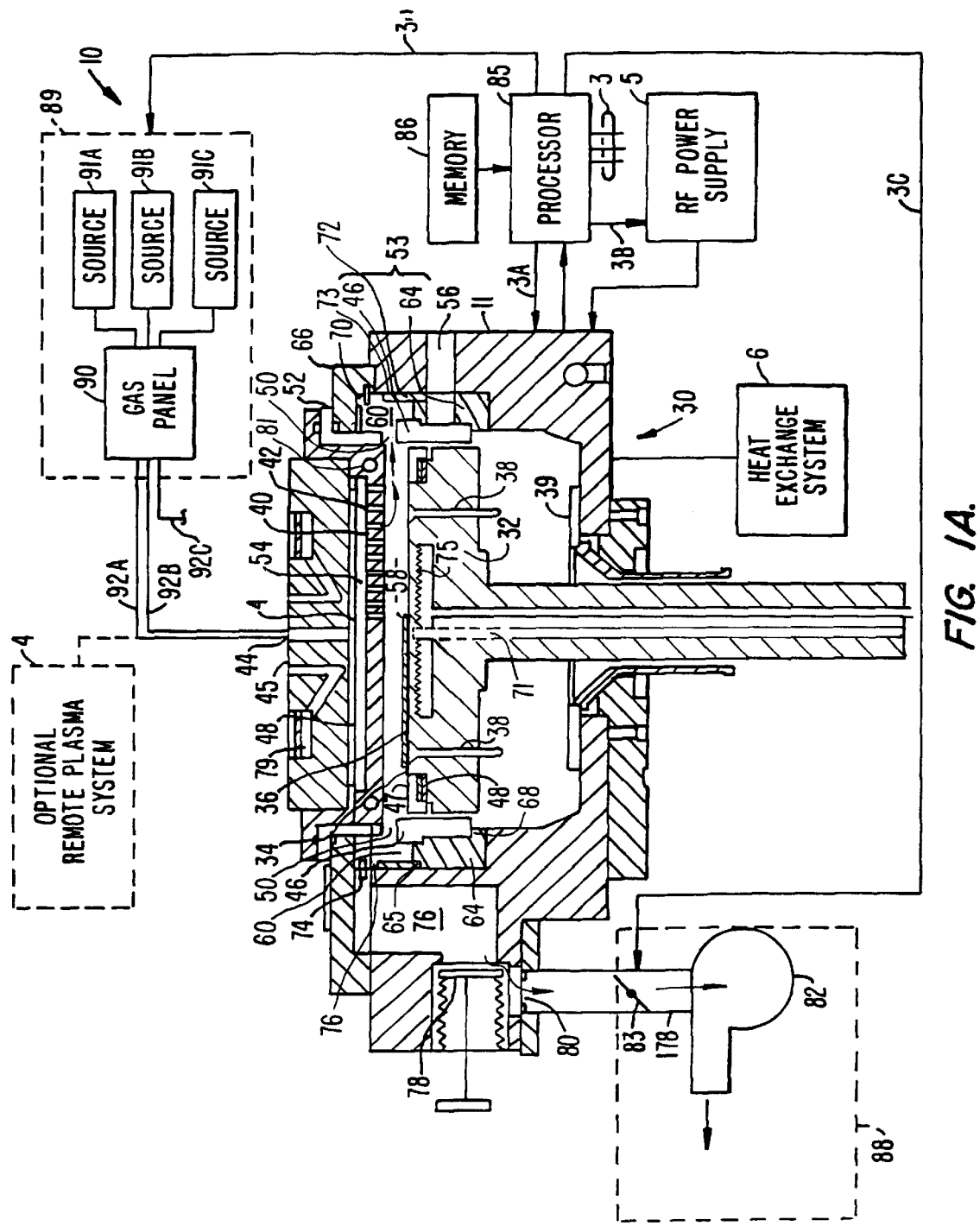
FIG. 1A is a block diagram of one embodiment of a deposition system according to the present invention, including a simplified cross-sectional view of the deposition chamber.

Referring to FIG. 1A, the CVD system 10 includes reactor chamber 30, which receives gases from a gas delivery system 89 via gas lines 92A–C (other lines may be present but not shown). A heater pedestal 32 within chamber 30 supports and heats a substrate 36 (only partially shown for simplicity). The heater pedestal 32 may be made of metal and may also be used with a ceramic coverplate in some embodiments. A vacuum system 88 is used to maintain a specified pressure in the chamber and removes gaseous byproducts and spent gases from the chamber. An RF power supply 5 provides radio-frequency power to the chamber for plasma-enhanced processes. A liquid heat exchange system 6 circulates a liquid heat exchange medium, such as water or a water-glycol mixture, through various portions of the reactor chamber (such as the walls and chamber lid) in order to remove heat from the reactor chamber and maintain certain portions of the chamber at a suitable temperature for stable process temperatures. Described further below, a processor 85 controls the operation of the heater pedestal 32, the chamber, heat exchange system 6, and other sub-systems according to instructions stored in memory 86 via control lines 3, 3A–D (only some of which are shown).

Pedestal 32 may be moved vertically between processing positions (for example, as shown in FIG. 1A) and a lower loading position using a self-adjusting lift mechanism, described in detail in commonly-assigned U.S. patent application No. 08/738,240, (filed on Oct. 25, 1996 and having inventors Leonid Selyutin and Jun Zhao), entitled "Self-Aligning Lift Mechanism," (Attorney Docket No. AM 1353) the disclosure of which is herein incorporated by reference. Lift pins 38 are slidable within pedestal 32 but are kept from falling out by conical heads on their upper ends. The lower ends of lift pins 38 may be engaged with a vertically movable lifting ring 39 and thus can be lifted above the pedestal's surface. With pedestal 32 in the lower loading position (slightly lower than a slit valve 56), a robot blade (not shown) in cooperation with the lift pins and the lifting ring transfers wafer 36 in and out of chamber 30 through slit valve 56, which can be vacuum-sealed to prevent the flow of gas into or out of the chamber through slit valve 56. Lift pins 38 raise an inserted wafer (not shown) off the robot blade, and then the pedestal rises to raise the wafer off the lift pins onto the wafer pocket on the upper surface of the pedestal. A suitable robotic transfer assembly is described in commonly-assigned U.S. Pat. No. 4,951,601, issued to Maydan, the complete disclosure of which is incorporated herein by reference.

Through the use of the self-aligning lift mechanism, pedestal 32 then further raises wafer 36 into the processing position, which is in close proximity to a gas distribution faceplate (hereinafter "showerhead") 40. The process gas is injected into reactor 30 through central gas inlet 44 in gas-feed cover plate 45 to a first disk-shaped space 48 and from thence through passageways 50 in a baffle plate (or gas blocker plate) 43 to a second disk-shaped space 54 to showerhead 40. Showerhead 40 includes a large number of holes or passageways 42 for jetting the process gas into process zone 58.

As indicated by the arrows, the process gas jets from holes 42 in showerhead 40 into processing zone 58 between the showerhead and the pedestal, so as to react at the surface of wafer 36. The process gas byproducts then flow radially outward across the edge of wafer 36 (when pedestal 32 is in the processing position), across a centering ring 47 disposed in an annular ledge 48 in the upper periphery of pedestal 32. From thence, the process gas flows through a choke aperture 50 formed between the bottom of annular isolator 52 and the top of chamber wall liner assembly 53 (made of ceramic ring 64 and an annular or band shield 46, which is disposed on an inside ledge 68 of ceramic ring 64) into pumping channel 60. Upon entering pumping channel 60, the exhaust gas is routed around the perimeter of the process chamber, to be evacuated by the vacuum pump 82. Pumping channel 60 is connected through exhaust aperture 74 to pumping plenum 76. As discussed in greater detail below, exhaust aperture 74 restricts the flow between the pumping channel and the pumping plenum. Valve 78 gates the exhaust through exhaust vent 80 to vacuum pump 82. Throttle valve 83 is controlled by the system controller (not shown in this view) according to a pressure control program stored in memory (not shown) which compares a measured signal from a pressure sensor (not shown), such as a manometer, against a desired value which is stored in memory or generated according to the control program.

Annular shield 46 may be made of any of several materials, depending on the particular process and its related deposition and cleaning chemistries. The shield should be made of a material that is compatible with the chemistries involved. In an embodiment suitable for titanium nitride deposition, shield 46 is made of aluminum. In another embodiment, the shield may be made of titanium for a deposition process for a titanium-containing layer because the shield material will not contaminate the deposited layer.

The sides of annular pumping channel 60 generally are defined by annular shield 46, ceramic ring 64, a chamber lid liner 70, a chamber wall liner 72, and an isolator 52, with the choke aperture 50 formed between isolator 52 and annular shield 46. Ceramic chamber liners of themselves are well known, for example, as described in commonly-assigned U.S. Pat. No. 5,366,585, issued to Robertson et al., the disclosure of which is hereby incorporated by reference. Chamber lid liner 70 is placed on the side of pumping channel 60 facing a lid rim 66 and conforms to its shape. Chamber wall liner 72 is placed on the side of pumping channel 60 facing main chamber body 11. Both liners 70 and 72 are preferably made of a metal, such as aluminum, and may be bead blasted to increase the adhesion of any film deposited thereon. Annular shield 46, the lid, and lid and wall chamber liners 70 and 72 are sized as a set. Chamber lid liner 70 is detachably fixed to lid rim 66 by a plurality of pins 75 that also electrically connect the lid liner to the lid rim. However, chamber wall liner 72 is supported on a ledge 65 formed on the outer top of ceramic ring 64 and is precisely formed to have a diameter such that radial gap 73 is formed between chamber wall liner 72 and main chamber body 11, and so that axial gap 76 is formed between the lid and chamber liners. That is, liner 72 is electrically floating.

Pumping channel 60 and its components are designed to minimize the effects of unwanted film deposition by directing the process gas and byproducts into the exhaust system. One approach to reducing unwanted depositions uses purge gas to blanket critical areas, such as ceramic parts and the heater edge and backside. Another approach is to design the exhaust system to direct the flow of reactive gas away from critical areas. The exhaust flow may form "dead zones", where little gas movement occurs. These dead zones approximate a purge gas blanket in that they displace reactive gases in that area and reduce unwanted depositions. Other specific descriptions of the exhaust channel system with liner assemblies which may be used with CVD system 10 are described in more detail in related U.S. patent application No. 08/680,724, the disclosure of which was earlier incorporated by reference for all purposes.

A titanium nitride TDMAT deposition process for the present invention, for example, in CVD system 10 may require a flow rate of about 0.4–2 liters/minute. In various embodiments, any undesired films may deposit on centering ring 47 or the annular shield 46 instead of on pedestal 32 or on the bottom of the chamber. Advantageously, the annular shield 46 minimizes the risk of unwanted deposition (with its associated problems) that might otherwise occur with the present invention's flow rates, which may alter the purge gas flow and dead zone patterns.

Some aspects of the CVD apparatus discussed above are common to an exemplary CVD chamber, as may be described in detail in commonly-assigned U.S. patent application Ser. No. 08/348,273, now U.S. Pat. No. 5,558,717 (filed on Nov. 30, 1994 and having inventors Zhao et al.), the disclosure of which has been incorporated by reference. Other aspects of CVD apparatus 10 in accordance with the present invention are described in further detail below.

Motors and optical sensors (not shown) are used to move and determine the position of movable mechanical assemblies such as throttle valve 83 and pedestal 32. Bellows (not shown) attached to the bottom of pedestal 32 and chamber body 11 form a movable gas-tight seal around the pedestal. The heater pedestal lift system, motors, gate valve, plasma system, including an optional remote plasma system 4 (which may be used to provide chamber clean capability using a remote plasma formed using, for example, a microwave source), and other system components are controlled by processor 85 over control lines 3 and 3A–D, of which only some are shown.

Processor 85 executes system control software, which is a computer program stored in a memory 86 coupled to processor 85. Preferably, memory 86 may be a hard disk drive, but of course memory 86 may be other kinds of memory. In addition to a hard disk drive (e.g., memory 86), CVD apparatus 10 in a preferred embodiment includes a floppy disk drive and a card rack. Processor 85 operates under the control of the system control software, which includes sets of instructions that dictate the timing, mixture of gases, gas flow, chamber pressure, chamber temperature, RF power levels, heater pedestal position, heater temperature and other parameters of a particular process. Other computer programs such as those stored on other memory including, for example, a floppy disk or other computer program product inserted in a disk drive or other appropriate drive, may also be used to operate processor 85. System control software will be discussed in detail below. The card rack contains a single-board computer, analog and digital input/output boards, interface boards and stepper motor controller boards. Various parts of CVD apparatus 10 conform to the Versa Modular European (VME) standard which defines board, card cage, and connector dimensions and types. The VME standard also defines the bus structure having a 16-bit data bus and 24-bit address bus.

Figure 1B:
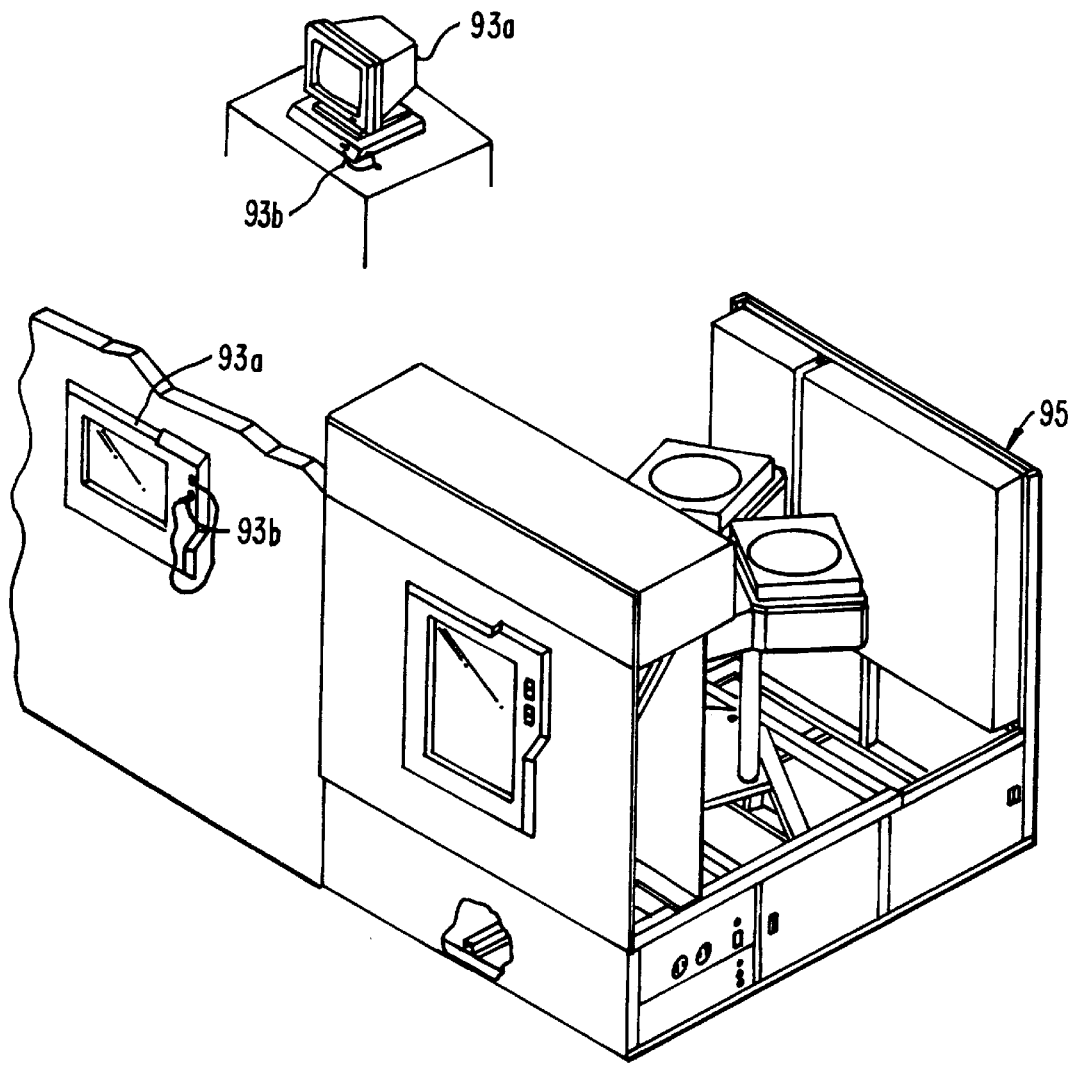
FIG. 1B shows an interface between a user and a processor that can control the deposition system of the present invention.

The interface between a user and processor 85 is via a CRT monitor 93a and a light pen 93b, shown in FIG. 1B which is a simplified diagram of the system monitor and CVD apparatus 10, illustrated as one of the chambers in a multichamber system. CVD apparatus 10 is preferably attached to a mainframe unit 95 which contains and provides electrical, plumbing and other support functions for the apparatus 10. Exemplary mainframe units compatible with the illustrative embodiment of CVD apparatus 10 may be currently commercially available as the Precision, the Centura, and the Endura systems from Applied Materials, Inc. of Santa Clara, Calif. The multichamber system has the capability to transfer a wafer between its chambers without breaking the vacuum and without having to expose the wafer to moisture or other contaminants outside the multichamber system. An advantage of the multichamber system is that different chambers in the multichamber system may be used for different purposes in the entire process. For example, one chamber may be used for deposition of a metal film, another may be used for rapid thermal processing, and yet another may be used for depositing an anti-reflective layer. The process may proceed uninterrupted within the multichamber system, thereby preventing contamination of wafers that often occurs when transferring wafers between various separate individual chambers (not in a multichamber system) for different parts of a process.

In the preferred embodiment two monitors 93a are used, one mounted in the clean room wall for the operators and the other behind the wall for the service technicians. Both monitors 93a simultaneously display the same information, but only one light pen 93b is enabled. The light pen 93b detects light emitted by CRT display with a light sensor in the tip of the pen. To select a particular screen or function, the operator touches a designated area of the display screen and pushes the button on the pen 93b. The touched area changes its highlighted color, or a new menu or screen is displayed, confirming communication between the light pen and the display screen. Of course, other devices, such as a keyboard, mouse, or other pointing or communication device, may be used instead of or in addition to light pen 93b to allow the user to communicate with processor 85.

Referring again to FIG. 1A, gas delivery system 89 includes gas supply panel 90 and gas or liquid or solid sources 91A–C (additional sources may be added if desired), containing gases, liquids, or solids that may vary depending on the desired processes used for a particular application. Generally, the supply line for each of the process gases includes a shut-off valve (not shown) that can be used to automatically or manually shut off the flow of process gas, as well as a mass flow controller (not shown) that measures the flow of gas or liquid through each of the supply lines. The rate at which the process and carrier gases including, for example, vaporized TDMAT with carrier gas of helium (He), argon, hydrogen ($H_2$), nitrogen ($N_2$) and/or other dopant or reactant sources, are supplied to reaction chamber 30 also is controlled by temperaturebased liquid or gas mass flow controllers (MFCs) (not shown) and/or by valves (not shown). Of course, it is recognized that other compounds may be used as deposition and clean sources. In alternative embodiments, the rate at which the process and carrier gases are supplied to reaction chamber 30 also may be controlled by a pressure-based fixed or variable aperture. When toxic gases (for example, ozone or halogenated gas) are used in the process, the several shut-off valves may be positioned on each gas supply line in conventional configurations. Gas supply panel 90 has a mixing system which receives the deposition process and carrier gases (or vaporized liquids) from the sources 91A–C for mixing and sending to a central gas inlet 44 in a gas feed cover plate 45 via supply lines 92A–C. In some embodiments, a bubbler system may be used in the gas mixing system such that a delivery or carrier gas such as helium is bubbled through a heated liquid, such as liquid TDMAT, to deliver a vaporized source gas, such as vaporized TDMAT, to the chamber. In other embodiments, the gas mixing system may include a liquid injection system to provide a source gas from a vaporized liquid source into the chamber. A liquid injection system vaporizes a measured quantity of liquid into a carrier gas stream. Because this type of system does not depend on the vapor pressure of the liquid for operation, the liquid does not need to be heated. A liquid injection system is preferred in some instances as it provides greater control of the volume of reactant liquid introduced into the gas mixing system compared to bubbler-type sources.

Liquid heat exchange system 6 delivers a heat exchange medium to various components of chamber 30 to maintain these components at a suitable temperature during the processing. This system 6 acts to decrease the temperature of the chamber body and some of these chamber components in order to minimize undesired deposition onto these components due to the processes. As seen in FIG. 1A, heat exchange passages 79 within gas feed cover plate 45 allow the heat exchange liquid to circulate through gas feed cover plate 45, thus maintaining the temperature of gas feed cover plate 45 and adjacent components. Liquid heat exchange system 6 includes connections (not shown) that supply the liquid (such as water) through a heat exchange liquid manifold (not shown) for delivering the liquid to the gas distribution system including faceplate 40 (discussed below). A liquid flow detector detects the flow of heat exchange liquid from a heat exchanger (not shown) to the enclosure assembly of the chamber.

The processes for depositing the film, such as TiN, and for dry cleaning (in some embodiments) the chamber can be implemented using a computer program product that is executed by processor 85. The computer program code can be written in any conventional computer readable programming language such as, for example, 68000 assembly language, C, C++, Pascal, Fortran, or other language. Suitable program code is entered into a single file, or multiple files, using a conventional text editor and is stored or embodied in a computer-usable medium, such as a memory system of the computer. If the entered code text is in a high-level language, the code is compiled, and the resultant compiler code is then linked with an object code of pre-compiled Windows library routines. To execute the linked compiled object code, the system user invokes the object code, causing the computer system to load the code in memory, from which the CPU reads and executes the code to perform the tasks identified in the program.

Figure 1C:
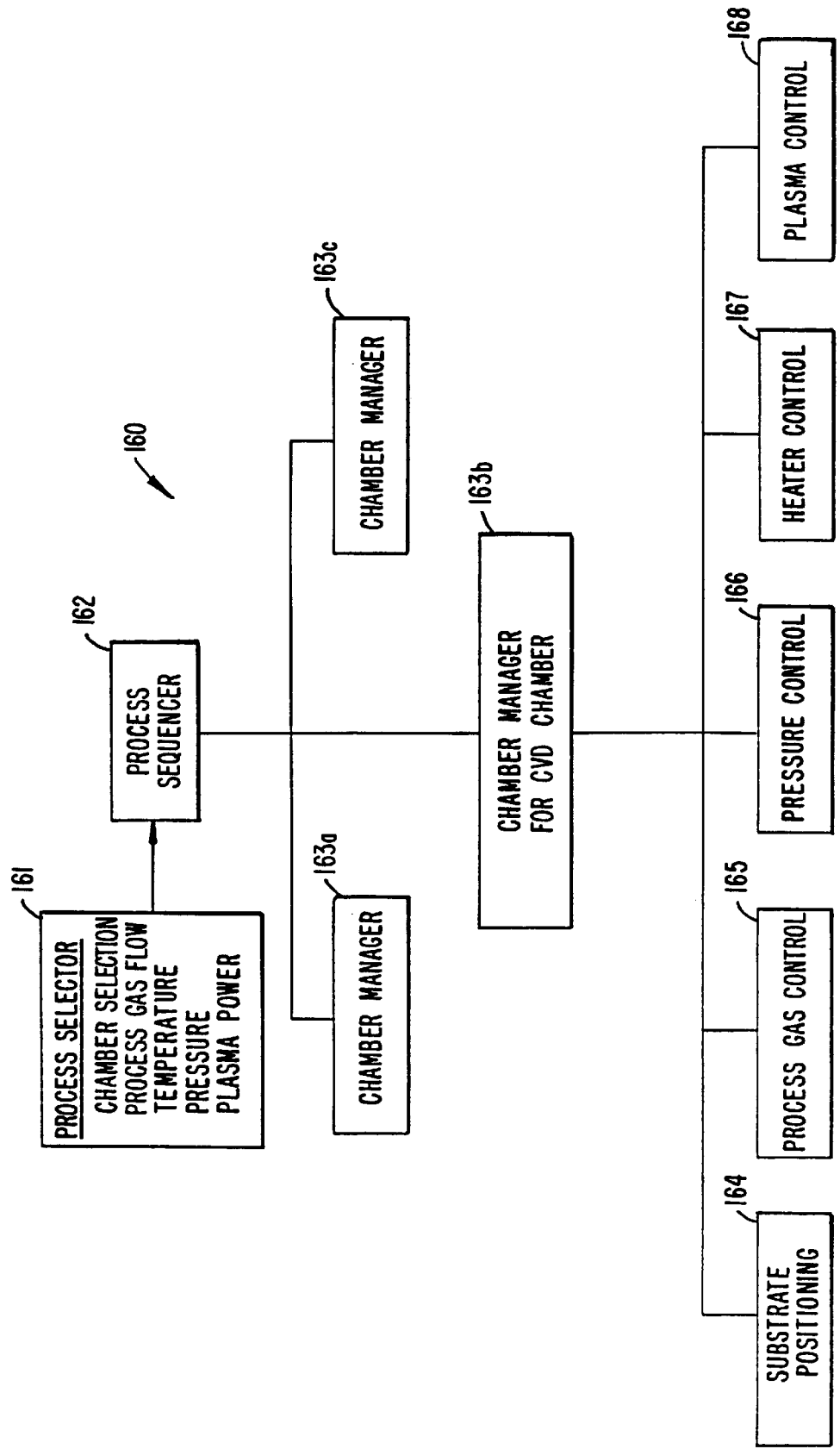
FIG. 1C shows an illustrative block diagram of the hierarchical control structure of the system control software, according to an embodiment of the present invention.

FIG. 1C is an illustrative block diagram of the hierarchical control structure of the system control software, computer program 160, according to a specific embodiment. Using a light pen interface, a user enters a process set number and process chamber number into a process selector subroutine 161 in response to menus or screens displayed on the CRT monitor. The process sets, which are predetermined sets of process parameters necessary to carry out specified processes, are identified by predefined set numbers. Process selector subroutine 161 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as high- and low-frequency RF power levels and the high-frequency and low-frequency RF frequencies, (and in addition, microwave generator power levels for embodiments equipped with remote microwave plasma systems) cooling gas pressure, and chamber wall temperature. Process selector subroutine 161 controls what type of process (deposition, wafer cleaning, chamber cleaning, chamber gettering, reflowing) is performed at a certain time in chamber 30. In some embodiments, there may be more than one process selector subroutine. The process parameters are provided to the user in the form of a recipe and may be entered utilizing the light pen/CRT monitor interface.

The signals for monitoring the process are provided by the analog input board and digital input board of the system controller, and the signals for controlling the process are output on the analog output board and digital output board of CVD system 10.

A process sequencer subroutine 162 comprises program code for accepting the identified process chamber and set of process parameters from process selector subroutine 161, and for controlling operation of the various process chambers. Multiple users can enter process set numbers and process chamber numbers, or a single user can enter multiple process set numbers and process chamber numbers, so sequencer subroutine 162 operates to schedule the selected processes in the desired sequence. Preferably, sequencer subroutine 162 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out. Conventional methods of monitoring the process chambers can be used, such as polling. When scheduling which process is to be executed, sequencer subroutine 162 can be designed to take into consideration the present condition of the process chamber being used in comparison with the desired process conditions for a selected process, or the "age" of each particular user-entered request, or any other relevant factor a system programmer desires to include for determining scheduling priorities.

Once sequencer subroutine 162 determines which process chamber and process set combination is going to be executed next, the sequencer subroutine 162 initiates execution of the process set by passing the particular process set parameters to a chamber manager subroutine 163a–c which controls multiple processing tasks in a process chamber 30 according to the process set determined by sequencer subroutine 162. For example, the chamber manager subroutine 163b comprises program code for controlling CVD operations in process chamber 30. Chamber manager subroutine 163b also controls execution of various chamber component subroutines which control operation of the chamber components necessary to carry out the selected process set. Examples of chamber component subroutines are substrate positioning subroutine 164, process gas control subroutine 165, pressure control subroutine 166, heater control subroutine 167, and plasma control subroutine 168. Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in process chamber 30. In operation, chamber manager subroutine 163b selectively schedules or calls the process component subroutines in accordance with the particular process set being executed. Chamber manager subroutine 163b schedules the process component subroutines much like sequencer subroutine 162 schedules which process chamber 30 and process set are to be executed next. Typically, chamber manager subroutine 163b includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIG. 1C. Substrate positioning subroutine 164 comprises program code for controlling chamber components that are used to load the substrate onto pedestal 32 and, optionally, to lift the substrate to a desired height in chamber 30 to control the spacing between the substrate and showerhead 40. When a substrate is loaded into process chamber 30, heater assembly 33 is lowered to receive the substrate on pedestal 32, and then is raised to the desired height. In operation, substrate positioning subroutine 164 controls movement of pedestal 32 in response to process set parameters related to the support height that are transferred from chamber manager subroutine 163b.

Process gas control subroutine 165 has program code for controlling process gas (such as vaporized TDMAT) composition and flow rates. Process gas control subroutine 165 controls the open/close position of the safety shut-off valves, and also ramps up/down the mass flow controllers to obtain the desired gas flow rate. Process gas control subroutine 165 is invoked by the chamber manager subroutine 163b, as are all chamber component subroutines, and receives subroutine process parameters related to the desired gas flow rates from the chamber manager. Typically, process gas control subroutine 165 operates by opening the gas supply lines and repeatedly (i) reading the necessary mass flow controllers, (ii) comparing the readings to the desired flow rates received from chamber manager subroutine 163b, and (iii) adjusting the flow rates of the gas supply lines as necessary. Furthermore, process gas control subroutine 163 includes steps for monitoring the gas flow rates for unsafe rates, and activating the safety shut-off valves when an unsafe condition is detected. Process gas control subroutine 165 also controls the gas composition and flow rates for clean gases as well as for deposition gases, depending on the desired process (clean or deposition or other) that is selected. Alternative embodiments could have more than one process gas control subroutine, each subroutine controlling a specific type of process or specific sets of gas lines.

In some processes, an inert gas such as nitrogen or argon is flowed into chamber 30 to stabilize the pressure in the chamber before reactive process gases are introduced. For these processes, process gas control subroutine 165 is programmed to include steps for flowing the inert gas into chamber 30 for an amount of time necessary to stabilize the pressure in the chamber, and then the steps described above would be carried out. Additionally, when a process gas is to be vaporized from a liquid precursor, process gas control subroutine 165 would be written to include steps for bubbling a delivery gas, such as helium, through the liquid precursor in a bubbler assembly, or for introducing a carrier gas, such as helium, to a liquid injection system. When a bubbler is used for this type of process, process gas control subroutine 165 regulates the flow of the delivery gas, the pressure in the bubbler, and the bubbler temperature in order to obtain the desired process gas flow rates. As discussed above, the desired process gas flow rates are transferred to process gas control subroutine 165 as process parameters. Furthermore, process gas control subroutine 165 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 166 comprises program code for controlling the pressure in the chamber 30 by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When pressure control subroutine 166 is invoked, the desired or target pressure level is received as a parameter from chamber manager subroutine 163b. The pressure control subroutine 166 measures the pressure in chamber 30 by reading one or more conventional pressure manometers connected to the chamber, compares the measure value(s) to the target pressure, obtains PID (proportional, integral, and differential) values corresponding to the target pressure from a stored pressure table, and adjusts the throttle valve according to the PID values obtained from the pressure table. Alternatively, pressure control subroutine 166 can be written to open or close the throttle valve to a particular aperture size to regulate the pumping capacity in chamber 30 to the desired level.

Heater control subroutine 167 comprises program code for controlling the temperature of a heater element 75 used to resistively heat pedestal 32 (and any substrate thereon). The heater control subroutine 167 is also invoked by the chamber manager subroutine and receives a target, or set-point, temperature parameter. The heater control subroutine measures the temperature by measuring voltage output of a thermocouple 71 located in pedestal 32, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 32, heater control subroutine 167 gradually controls a ramp up/down of current applied to the loop. Additionally, a built-in fail-safe mode can be included to detect process safety compliance, and can shut down operation of the heating unit if the process chamber 30 is not properly set up.

In an alternative embodiment, the resistance of heater element 75 in heater 32 may be used as an alternative to using thermocouple 71, thus potentially eliminating the thermocouple from the heater assembly. By characterizing the resistance of a particular heater element versus temperature, and measuring the current drawn through the heater element at an operating voltage, the temperature of the heater element during operation may be determined. Preferably, a test wafer with temperature sensors is used to correlate the heater element temperature to the temperature present on the surface of a wafer. Measuring the voltage at an operating current would provide similar information. In either instance, the controller would use the heater element voltage-current data in lieu of the thermocouple voltage output.

A plasma control subroutine 168 comprises program code for setting low-and high-frequency RF power levels applied to the process electrodes in chamber 30 and heater assembly 32, and for setting the low and high RF frequency employed. Like the previously described chamber component subroutines, plasma control subroutine 168 is invoked by chamber manager subroutine 163b. For embodiments including remote plasma generator 4, plasma control subroutine 168 would also include program code for controlling the remote plasma generator.

Referring to FIG. 1A, a valve assembly (throttle valve system) includes an isolation valve 78 and a throttle valve 83 disposed along discharge line 178 for controlling the flow rate of the gases through pumping channel 60. The pressure within processing chamber 30 is monitored with capacitance manometers (not shown) and controlled by varying the flow cross-sectional area of conduit 178 with throttle valve 82. Preferably, processor 85 receives signals from the manometers that indicate the chamber pressure. Processor 85 compares the measured pressure value with set-point pressure values entered by operators (not shown), and determines the necessary adjustment of the throttle valve that is required to maintain the desired pressure within the chamber. Processor 85 relays an adjustment signal to a drive motor (not shown), which adjusts the throttle valve to a setting corresponding to the set-point pressure value. Suitable throttle valves for use with the present invention are described in commonly-assigned, co-pending application Ser. No. 08/672,891 entitled "Improved and Methods for Controlling Process Chamber Pressure" (Attorney Docket No. 891/DCVD-II/MBE), filed Jun. 28, 1996, the complete disclosure of which is incorporated herein by reference.

Isolation valve 78 may be used to isolate process chamber 30 from the vacuum pump 82 to minimize the reduction of chamber pressure due to the pumping action of the pump. Seen in FIG. 1A, isolation valve 78, together with throttle valve 83, may also be used to calibrate the mass flow controllers (not shown) of CVD apparatus 10. In some processes, a liquid source is vaporized, and then delivered into process chamber 30 along with a carrier gas. The mass flow controllers are used to monitor the flow rate of the gas or liquid into the chamber 30. During calibration of the MFCs, isolation valve 78 restricts or limits the gas flow to throttle valve 83 to maximize the pressure increase in chamber 30, which facilitates MFC calibration.

The CVD system description presented above is illustrative and should not necessarily be considered as limiting the scope of the present invention. The exemplary CVD system 10 is a single-wafer vacuum chamber system. However, other CVD systems that are multiple-wafer chamber systems may be used in other embodiments of the invention. It should be understood, however, that although certain features of the invention are shown and described as part of a CVD chamber in a multichamber processing system, the invention is not necessarily intended to be limited in this manner. That is, various aspects of the invention can be used in a variety of processing chambers, such as etch chambers, diffusion chambers or the like. Variations of the above described system such as variations in design, heater design, location of RF power connections, software operation and structure, specific algorithms used in some software subroutines, configuration of gas inlet lines and valves, and other modifications are possible. Further, the specific dimensions described above are provided for specific embodiments, but of course other embodiments may have different dimensions. Additionally, some embodiments of the invention may be used in other substrate processing apparatus, including CVD equipment such as electron cyclotron resonance (ECR) plasma CVD devices, induction coupled RF high density plasma CVD devices, or the like. The methods for forming layers, such as a titanium nitride film, may not necessarily be limited to any specific apparatus or to any specific plasma excitation method.

II. High Temperature Processes Using the CVD Reactor System

A. Exemplary Structures and Applications

Figure 2:
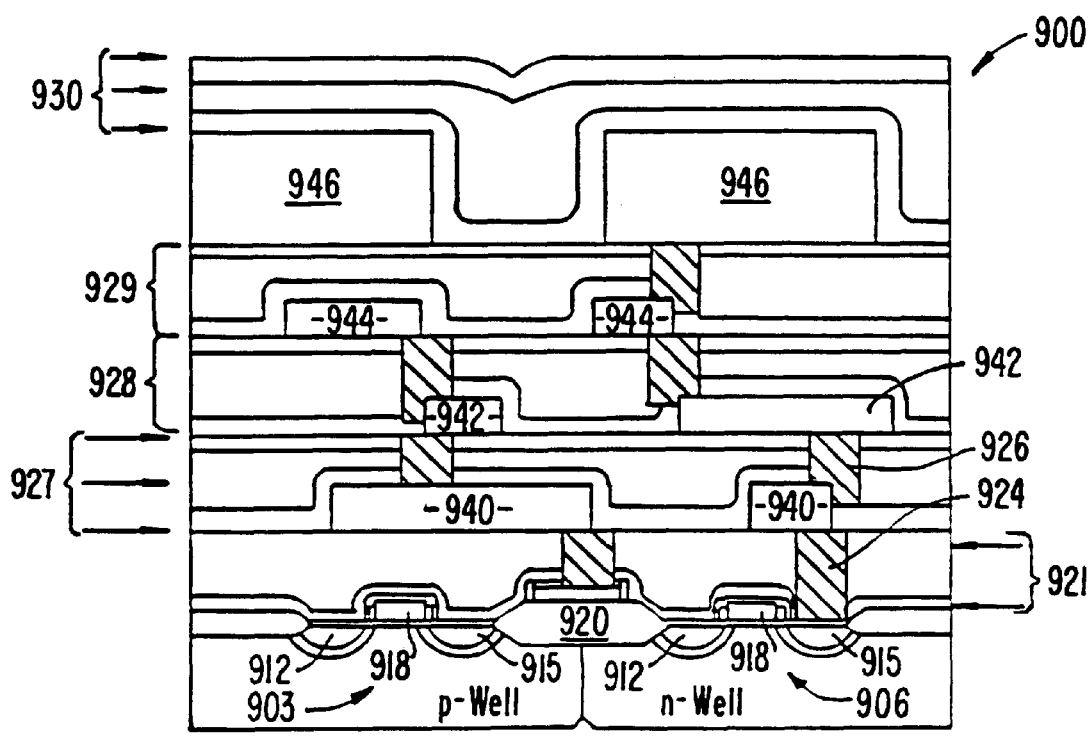
FIG. 2 shows a simplified cross-sectional view of a device fabricated according to one aspect of the present invention.

FIG. 2 illustrates a simplified cross-sectional view of an integrated circuit 900 according to the present invention. As shown, integrated circuit 900 includes NMOS and PMOS transistors 903 and 906, which are separated and electrically isolated from each other by a field oxide region 920 formed by local oxidation of silicon (LOCOS), or other technique. Alternatively, transistors 903 and 906 may be separated and electrically isolated from each other by a shallow trench isolation (not shown) when transistors 903 and 906 are both NMOS or both PMOS. Each transistor 903 and 906 comprises a source region 912, a drain region 915 and a gate region 918.

A premetal dielectric (PMD) layer 921 separates transistors 903 and 906 from metal layer 940 with connections between metal layer 940 and the transistors made by contacts 924. Metal layer 940 is one of four metal layers 940, 942, 944, and 946, included in integrated circuit 900. Each metal layer 940, 942, 944, and 946 is separated from adjacent metal layers by respective inter-metal dielectric layers 927, 928, and 929. Adjacent metal layers are connected at selected openings by vias 926. Deposited over metal layer 946 are planarized passivation layers 930. CVD apparatus 10 may be used to deposit films used, for example, as metal layers 940, 942, 944, or 946. These layers may consist of multiple sub-layers, such as a titanium layer underlying an aluminum, gold, platinum, or tungsten layer. CVD 10 also may be used to deposit contacts 924 or plugs in the device structure.

Figure 3:
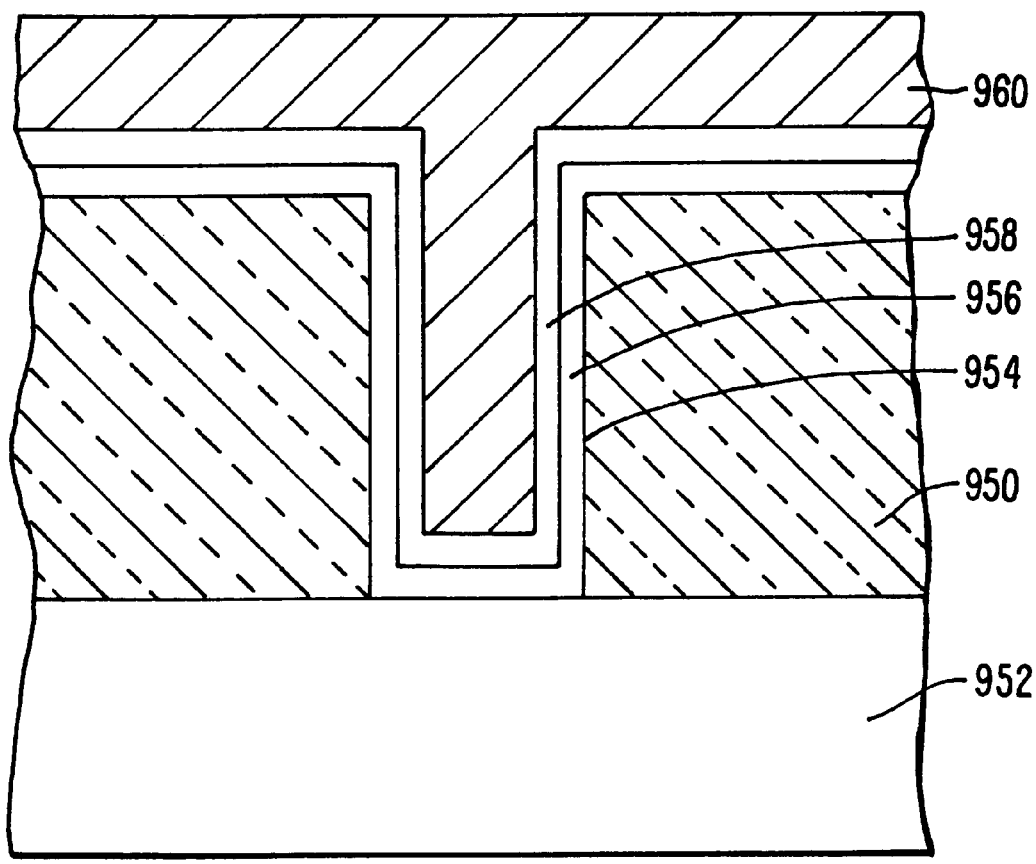
FIG. 3 is a simplified cross-sectional view of a contact in a device fabricated according to an aspect of the present invention.

FIG. 3 is a cross-sectional view of an exemplary contact structure (such as contact 924 or vias 926 of FIG. 2 with which embodiments of the present invention may be used. As seen in FIG. 3, an oxide layer 950, typically $SiO_2$, is deposited to a thickness of about 1 $\mu$m over a substrate 952 having a surface of crystalline silicon or polysilicon. Oxide layer 950 may act as a pre-metal dielectric or as an inter-level dielectric, but to provide electrical contact between levels a contact hole 954 is etched through oxide layer 950 to be filled with a metal such as aluminum. However, in advanced integrated circuits, contact hole 954 is narrow, often less than about 0.35 $\mu$m, and has an aspect ratio of about 6:1 or greater. Filling such a hole is difficult, but a somewhat standard process has been developed in which hole 954 is first conformally coated with a titanium layer 956, and titanium layer 956 is then conformally coated with a titanium nitride layer 958. Thereafter, an aluminum layer 960 is deposited, often by physical vapor deposition, to fill the contact hole 954 and to provide electrical interconnection lines on the upper level. The Ti layer 956 provides a glue layer to both the underlying silicon and the oxide on the sidewalls. Also, it can be silicided with the underlying silicon to form an ohmic contact. The TiN layer 958 bonds well to the Ti layer 956, and the aluminum layer 960 wets well to the TiN so that the aluminum can better fill contact hole 954 without forming an included void. Also, TiN layer 956 acts as a barrier to prevent aluminum 960 from migrating into silicon 952 and affecting its conductivity. In a via structure in which substrate 952 includes an aluminum surface feature, the Ti layer 956 may not be needed. Even though the electrical conductivities of titanium and titanium nitride are not nearly as high as that of aluminum, they are sufficiently conductive in thin layers to provide a good electrical contact. Preferred embodiments of the present invention may be used to deposit TiN layer 958, and other embodiments may be used to deposit Ti layer 956 as well as other layers.

It should be understood that simplified integrated circuit 900 of FIG. 2 and the contact structure of FIG. 3 are for illustrative purposes only. One of ordinary skill in the art could implement the present method for fabrication of other integrated circuits such as microprocessors, application specific integrated circuits (ASICs), memory devices, and the like, as well as discrete devices. Further, the present invention may be applied to PMOS, NMOS, CMOS, bipolar, or BiCMOS devices. Although applications related to the deposition of metal films are discussed above, the present invention also may be used in other applications, such as intermetallic deposition, spontaneous formation of an intermetallic film from a metal deposition, or doped film deposition. The invention is of course applicable to many other types of metal CVD processes and should be useful in dielectric CVD and other plasma applications as well.

B. Exemplary Processes

Figure 4:
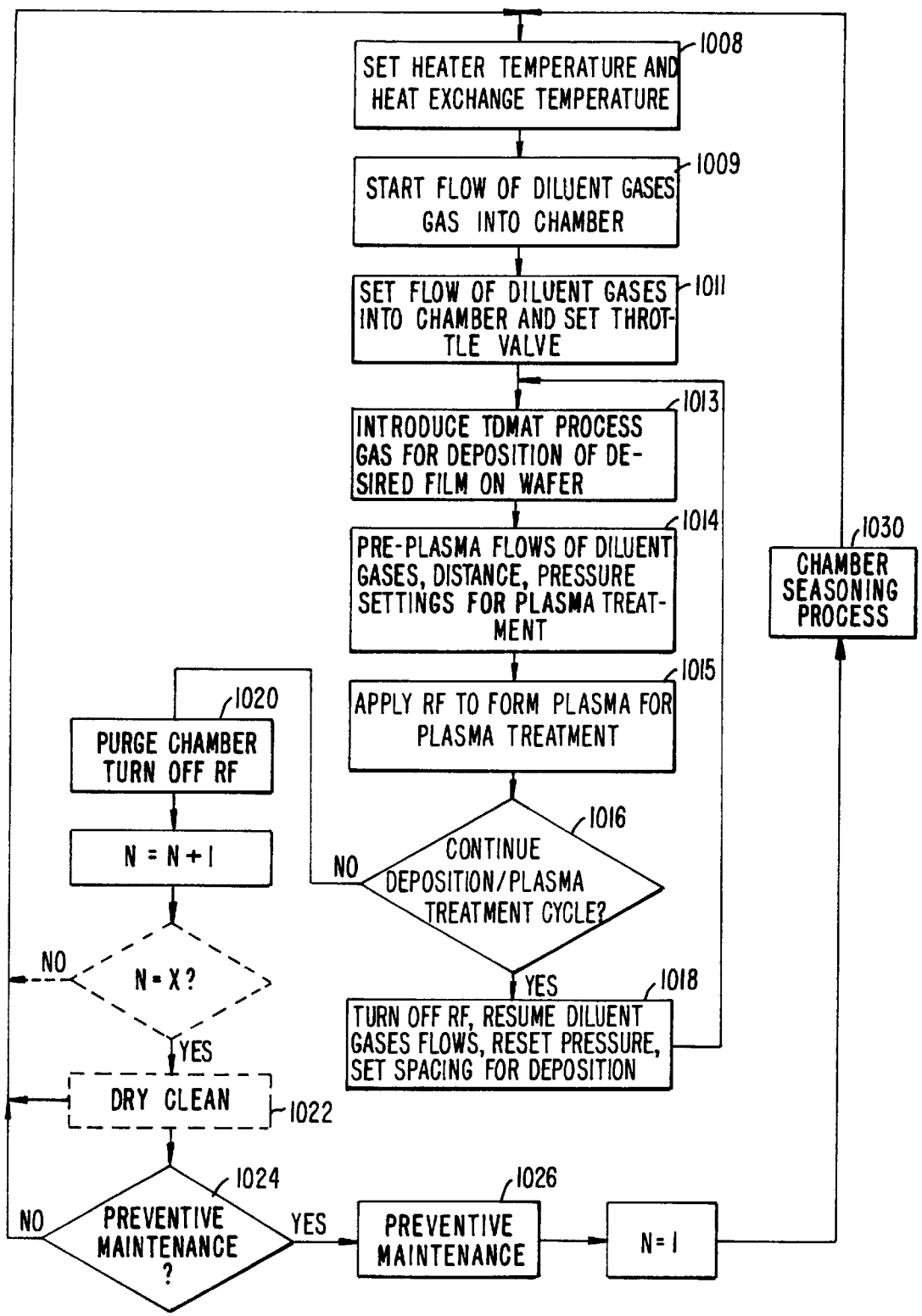
FIG. 4 is a flow chart of a process sequence that can be used with one embodiment of the invention, according to an embodiment of the present invention.

FIG. 4 shows a flow chart of steps in exemplary processes that may be used in the above CVD system to deposit films such as titanium nitride films on substrates, in accordance with specific embodiments of the present invention. These exemplary processes use thermal chemical vapor deposition to produce titanium nitride films at deposition rates about 10 Å/second (about 600 Å/minute) or greater from a vaporized TDMAT source. This deposition rate allows shorter processing time per wafer, and hence greater wafer throughput from the deposition system. It is noted that with prior processes, chamber hardware conditions often fluctuated from when the chamber is idling to when the chamber runs a deposition process. The fluctuating chamber hardware conditions resulted in process inconsistencies which was undesirable for depositing films meeting process specifications and repeatability requirements. The present invention optimizes the heater temperature, heat exchange temperature, and the selection of gases flowed into the chamber in order to minimize the change in chamber hardware conditions from idling to processing. The present invention also provides a seasoning of the chamber by depositing a pre-coating of the deposited film in order to help minimize the number of processed substrates that fail to meet process specifications. The increased heater temperature of the heater 32 with the selected gases flowed and the decreased heat exchange temperature used with the present invention are believed to provide the desired substrate temperatures and additional efficiency benefits, such as fewer wasted substrates, than typically achieved with other conventional TDMAT processes in CVD systems. In particular, the stabilization of the chamber equipment using the lowered heat exchange temperature is a way to provide a more efficient process with less particle contamination problems due to unwanted deposition on the chamber equipment. Another way to provide improved efficiency is the use of the apparatus as discussed above. An exemplary substrate processing system suitable for performing these processes is the TxZ system (equipped for 200-mm wafers or scalable to 300-mm or other sized wafers), available from Applied Materials, Inc. of Santa Clara, Calif.

In running deposition (and dry cleaning, in some embodiments) processes in CVD system according to the present invention, heat exchange system 6 circulates heat exchange fluid, specifically a water-glycol mixture, through various passages in the chamber body, walls and lid, at a heat exchange temperature of between 40–65° C., preferably about 60° C. or less in some embodiments, and about 50° C. in the specific embodiment. It is believed that the advantages of the present invention will also be present with even lower heat exchange temperatures when used for different processes using selected gases at flow rates and heater temperatures higher than those used in conventional processes. The specific values used for the heater temperature and the heat exchange temperature would be optimized for different processes according to various specific embodiments. During the exemplary process, the heater temperature is held constant. The chamber pressure may be between about 1–3 torr during the deposition, preferably about 1.5 torr in the specific embodiment for titanium nitride, and between about 0.5–5 torr during the plasma treatment, preferably about 1.3 torr in the specific embodiment. In the exemplary processes discussed herein, deposition of titanium nitride and a subsequent plasma treatment are performed, for example, two times in order to provide the desired overall film thickness. However, it is recognized that fewer or more deposition/plasma treatment cycles may be performed depending on the desired overall thickness of the film for different applications. The deposition for each deposition step in a deposition/plasma treatment cycle also may be varied depending on the desired per-cycle thickness of the deposited film.

The first step in the process is to set the heater temperature (step 1008). The process may be performed preferably at heater temperatures between about 400–500° C., about 450° C. in the specific embodiment for the titanium nitride process. For the first wafer processed upon completion of first use of the chamber or a wet clean, the wafer count N is set to 1. In step 1008, the heater temperature is initially set to the desired temperature, about 450° C. in this specific embodiment, and the wafer is loaded into the chamber. During step 1008, the throttle valve is fully open for pumping the chamber. The heater temperature is set higher than the desired substrate temperature because the flow of process gases used with the present invention will cool the temperature of the substrate in relation to the heater temperature. The heat exchange temperature is also set in step 1008 to the level discussed above for the specific embodiment.

After loading the wafer onto the heater at heater temperature set to, in this instance about 450° C., gases used in the process are initially flowed into the chamber (step 1009). Specifically, a first diluent gas, such as helium, is flowed into the chamber (step 1009). Suitable flow rates of the first diluent gas range between about 0–100 standard cubic centimeters per minute (sccm), preferably about 500 sccm, for a chamber with a volume of about 5.5 liters. During step 1009, a second diluent gas, such as nitrogen ($N_2$), is also introduced at flow rates of about 100–1000 sccm, about 300 sccm in the specific embodiment, into the chamber. Initiating the gas flows in step 1009 allows the thermal capacity of the heater to account for some of the cooling arising from the onset of the gas flow prior to the deposition. During step 1009 which lasts about between 5–60 seconds, about 20 seconds in the specific embodiment, and in step 1008 the wafer is held about 500 mil (the distance for deposition in the specific embodiment) from the showerhead, and the chamber is pumped down to about 5 torr by servo for subsequently pumping to the desired deposition pressure. It is understood that greater or lesser flow rates would be appropriate for larger or smaller chambers. In the last 5 seconds of step 1009, the spacing is moved to the spacing, about 200–600 mil and preferably about 270 mil in the specific embodiment, used for deposition.

In the next step (step 1011), the first and second diluent gas flows are each maintained while the throttle valve is opened to a 240 setting for about 5 seconds and then to a 295 setting for 25 seconds in the specific embodiment. In the specific embodiment, a throttle valve having a setting at about 800 steps for a fully open throttle and a setting of about 100 steps for a fully closed throttle was used to provide certain pressures depending on the fixed setting of the throttle valve. Step 1011 lasts about 5–60 seconds, about 30 seconds in the specific embodiment, in order to set the chamber pressure for deposition by adjusting the throttle valve opening and to flow the gases, except for the process gas of vaporized TDMAT, used for deposition. The flow of the diluent gases serves to lower the substrate temperature, which may be about 380–410° C. by step 1011.

With the chamber purged with diluent gases, step 1013 is the deposition of the desired film, titanium nitride in the specific embodiment, which occurs with the desired deposition substrate temperature and the desired deposition pressure set by servo at 1.5 torr in the specific embodiment. In particular, during the deposition, the first diluent gas flow rate decreases to 275 sccm while the flow rate of the second diluent gas remains constant. The process gas, vaporized TDMAT, is also introduced into the chamber in step 1013. In the specific embodiment, the carrier or delivery gas is helium which has a flow rate of about 100–500 sccm, preferably about 225 sccm in the specific embodiment, is bubbled through a liquid TDMAT source heated to a temperature of about 40–70° C., preferably about 50° C., and having a vapor pressure of about 0.5–2 torr, preferably about 0.6 torr. Due to the flow of these gases into the chamber, the substrate temperature during step 1013 reaches the desired temperature for deposition which is about 360–390° C., about 372° C. in the specific embodiment. Deposition lasts about 16 seconds in the specific embodiment, but may differ depending on the desired thickness of the deposited film. The deposition step 1013 of the preferred embodiment results in deposition of a titanium nitride film with about 160 Å thickness. Of course, higher liquid TDMAT temperatures and/or higher carrier gas flows may be used to achieve higher deposition rates.

Following deposition step 1013 is a pre-plasma step 1014 and a plasma treatment step 1015. In step 1014, the first diluent gas flow and the vaporized TDMAT gas flow into the chamber are discontinued, the second diluent gas flow decreases to 200 sccm in the specific embodiment, and hydrogen ($H_2$) gas is flowed into the chamber at about 100–1000 sccm, about 300 sccm gas flow in the specific embodiment. The vaporized TDMAT gas and the first diluent gas are also not flowed into the chamber during the plasma treatment step 1015. During step 1014, the heater 32 is moved to the desired distance, about 400 mil in the specific embodiment, from the showerhead for the plasma treatment step 1015, and pressure in the chamber is set by throttle at a 265 setting to pump the chamber to the desired plasma pressure, which is about 1.3 torr in the specific embodiment, of step 1015 by servo. The setting of certain chamber pressures by servo is achieved by the rapid alternatively opening and closing of the throttle valve at a certain rate to achieve the desired chamber pressure. The particular plasma pressure used may be optimized to control the amount of deposited film sputtered away and carbon removed from the deposited film. The nitrogen gas flow and the hydrogen ($H_2$) gas flow are maintained from step 1014 in step 1015. In plasma treatment step 1015, RF energy is applied to the showerhead (used as an electrode in the specific embodiment) to provide a plasma that reduces the excess carbon in the deposited titanium nitride film. In the specific embodiment, the RF energy is about 300–450 kilohertz (kHz) at a power level of up to about 1000 watts, and about 350 kHz at about 750 watts in the specific embodiment. The pre-plasma step 1014 lasts about 3 seconds in the specific embodiment, while the plasma treatment step 1015 lasts about 32 seconds in the specific embodiment.

In the plasma treatment step 1015, the substrate temperature increases to about 360–410° C. from that during deposition, and the flow of the nitrogen and hydrogen gases serves to manage the substrate temperature increase due to heat from the plasma to an acceptable level. In particular, hydrogen gas also has particularly good thermal transfer properties that are useful for maintaining the substrate at an acceptable temperature during the plasma treatment. Hydrogen species in the plasma react with carbon impurities in the titanium nitride film to produce hydrocarbons that can easily outdiffuse from the substrate surface. In the plasma related steps 1014 and 1015, the TDMAT gas and first diluent gas in the chamber are replaced by a gas mixture of $H_2$ and $N_2$ in about a 3:2 ratio at a pressure of about 1.3 torr, with the RF power source switched on to create electric fields between the showerhead 40 and the heater pedestal 32 sufficient to discharge the $H_2$:$N_2$ gas to form the plasma. As discussed earlier, the hydrogen and nitrogen species in the plasma reduce the carbonaceous polymer in the titanium nitride film to volatile byproducts which are exhausted from the system. The plasma treatment thereby removes the carbon to improve the quality of the titanium nitride film.

The plasma treatment of step 1015 densifies the deposited film and has sputtering effects on the deposited film which reduce its thickness from 40–50% from the as-deposited thickness, e.g., from about 160 Å from step 1013 to about 100 Å in the specific embodiment.

If the deposition/plasma treatment cycle is desired to repeat (indicated by step 1016), then the system performs pre-deposition step 1018 before proceeding to deposition according to step 1013 discussed earlier. In step 1018, the chamber pressure is changed to the deposition pressure, the RF is turned off, the heater is also repositioned to the distance from the showerhead for deposition, and the gas flows transition from the plasma gas flows of hydrogen and nitrogen to a first diluent helium gas flow of about 800 sccm. Step 1018 takes about 5–60 seconds, about 18 seconds in the specific embodiment. In step 1018, the helium flow into the chamber at this flow rate starts to reduce the substrate temperature back down to the desired substrate temperature for deposition. Then the system returns to the deposition conditions of step 1013 where the cycle is repeated per FIG. 4.

However, if the cycle is not desired to repeat (e.g., the thickness of the deposited/treated film is sufficient after a particular number of deposition/plasma treatment cycles and increasing the overall thickness of the deposited/treated film is not desired), then the system proceeds to step 1020 and increments the wafer count from N to N+1. In step 1020, the RF is turned off and the chamber is purged with the throttle valve fully open. Also in step 1020, argon purge gas is flowed into the chamber at 100–2000 sccm, about 500 sccm in the specific embodiment, and the second diluent nitrogen gas flow is increased to about 500 sccm, respectively in the specific embodiment. Step 1020, which lasts about 5–8 seconds in the specific embodiment, purges the chamber with gas flow so that the processed wafer may be transferred from the chamber and the next wafer transferred into the chamber for processing resuming at step 1008 for this next wafer. For some embodiments where a dry clean process is performed, the dry clean process (which is done without opening the chamber lid) may be performed periodically (as indicated by 1022 in dotted line) on the chamber after a certain number of wafer deposition processes (i.e., if the wafer count N=X). The dry clean process may be run between every "X" wafers, preferably 1–25 wafers, or 3–5 wafers in some embodiments. After the optional dry clean of step 1022, the system transfers the next wafer into the chamber and resumes at step 1008.

In addition to or alternatively to dry cleaning, a wet or preventive maintenance cleaning procedure is utilized to avoid wafer contamination. If needed (indicated by decision box 1024), a preventive maintenance clean is performed in step 1026, the wafer count N is set to 1 and the system transfers the first wafer into the chamber and starts up at step 1008. As discussed earlier, it is recognized that wet cleans or preventive maintenance cleanings (occurring between several thousands of processed wafers in the specific embodiment) may be performed by opening the chamber lid to manually clean various parts of the chamber with solvents. If a preventive maintenance cleaning is not yet needed (e.g., the amount of successive wafers (typically in the thousands of wafers) for which the process has been run is not sufficient to warrant a cleaning), then the system transfers the next wafer into the system and resumes at step 1008.

After any preventive maintenance cleaning and/or initial use of a chamber, a seasoning process is performed (step 1030) where a layer of titanium nitride is deposited as a pre-coating onto the chamber equipment for about 180 seconds while the vaporized TDMAT flow and helium and nitrogen diluent gas flows are run at the same conditions as for deposition (see step 1013) with all other deposition conditions met as well. Accordingly, about 1800 Å or about the equivalent of 2–8 wafer depositions of titanium nitride are pre-coated onto the chamber. The seasoning is beneficial for providing contamination prevention discussed above.

It is noted that in the specific embodiment, there were two cycles of titanium nitride deposition and plasma treatment per wafer, with the overall thickness of the deposited and plasma treated film being about 200 Å with a deposition rate of about 10 Å/second. It should be recognized that different thicknesses may be used in other processes, plasma treatment might not be used in some applications, and that other films besides titanium nitride, which is a specific embodiment, may be deposited in accordance with the present invention.

III. Test Results And Measurements

In accordance with the specific embodiment discussed above in the exemplary processes, experiments were performed to deposit a titanium nitride film with good gap filling, low resistance, and good uniformity characteristics. The experiments were performed in a TxZ deposition system (manufactured by Applied Materials, Inc.) having a resistively-heated heating assembly and configured for a 200-mm wafer. The experimental conditions were generally chosen to approximate the conditions during deposition of a titanium nitride film onto a wafer, according to a specific embodiment described above, except as indicated below. Importantly, the heat exchange temperature of the chamber body was held at about 50° C. by circulation of heat exchange medium, a water-glycol mixture, throughout passages within the chamber walls.

Figure 5:
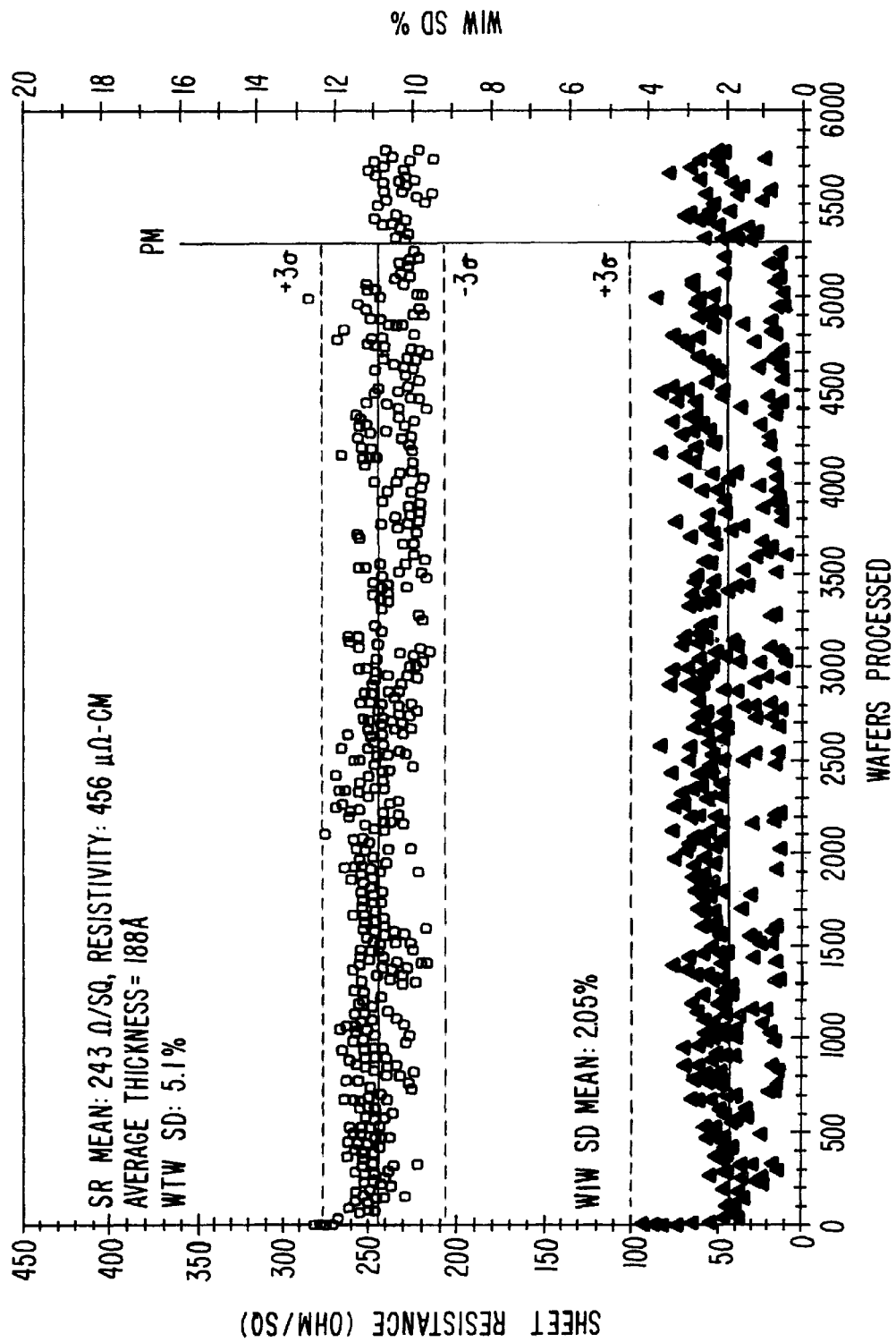
FIG. 5 is a diagram illustrating measurements of the sheet resistance (Ω/square) on the left axis and the sheet resistance standard deviation (%) on the right axis for an extended wafer run, as an illustration of the capabilities of a specific embodiment of the present invention.

FIG. 5 is a diagram showing measurements of the sheet resistance ($\Omega$/square) on the left axis and the sheet resistance standard deviation (%) on the right axis for a marathon wafer process run of over 5000 wafers before a preventive maintenance cleaning was performed. The wafers were processed according to the specific embodiment and a preventive maintenance cleaning was performed after an extended run of about 5300 consecutive wafers. Sheet resistance measurements in FIG. 5 were performed using 4-point probe technology, as is well known. In FIG. 5, sheet resistance measurements are indicated by points shown as squares, and sheet resistance standard deviations are indicated by points shown as triangles. In the experiment, no dry clean procedure was performed for experimental results discussed in this section on experimental results. As seen in FIG. 5, the sheet resistance for most of the wafers, except for a small amount (less than 100) of initial wafers, in the extended wafer run prior to preventive maintenance cleaning ranges between about 210 to 280 $\Omega$/square. The sheet resistance mean was about 243 $\Omega$/square with a resistivity of about 456 $\Omega$/square, and the average film thickness was about 188 Å and the average wafer-to-wafer standard deviation (for 3 $\sigma$) was measured to be about 5.1%. Also as seen in FIG. 5, the sheet resistance within-wafer (with a 3-mm edge exclusion) standard deviation (for 3 $\sigma$) for most of the wafers, except for a small amount (less than 100) of initial wafers, in the extended wafer run prior to preventive maintenance cleaning ranges between about 0 to 4%. The within-wafer standard deviation mean (for 3 $\sigma$) was about 2.05%. In general, FIG. 5 illustrates that the TiN film deposited on an extended wafer run using the above described process meets sheet resistance specifications.

Figure 6:
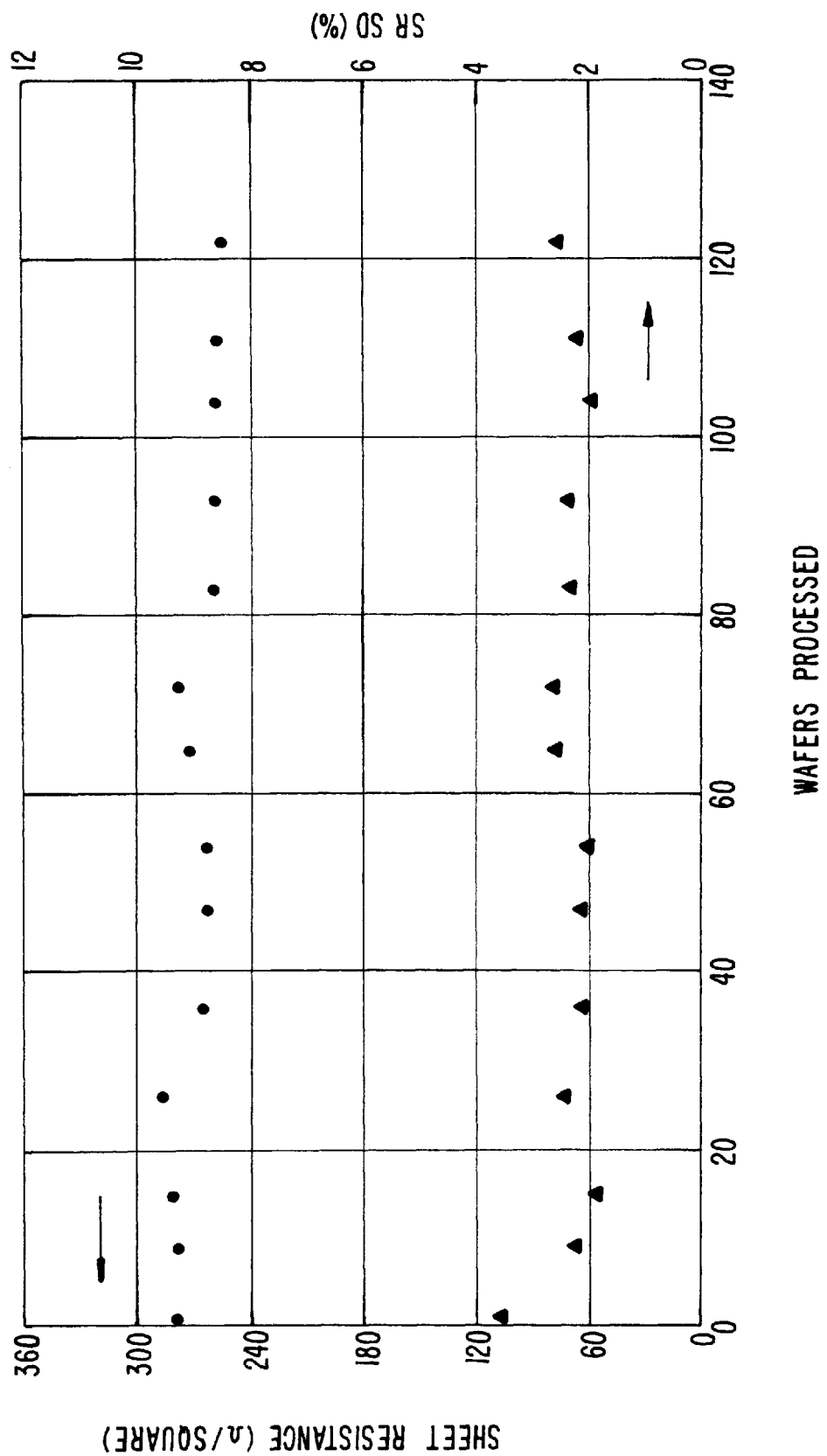
FIG. 6 is a diagram showing measurements of the sheet resistance (Ω/square) on the left axis and the sheet resistance standard deviation (%) on the right axis for a sampling of consecutive initially processed wafers, as an illustration of the advantages of a specific embodiment of the present invention.
Figure 7:
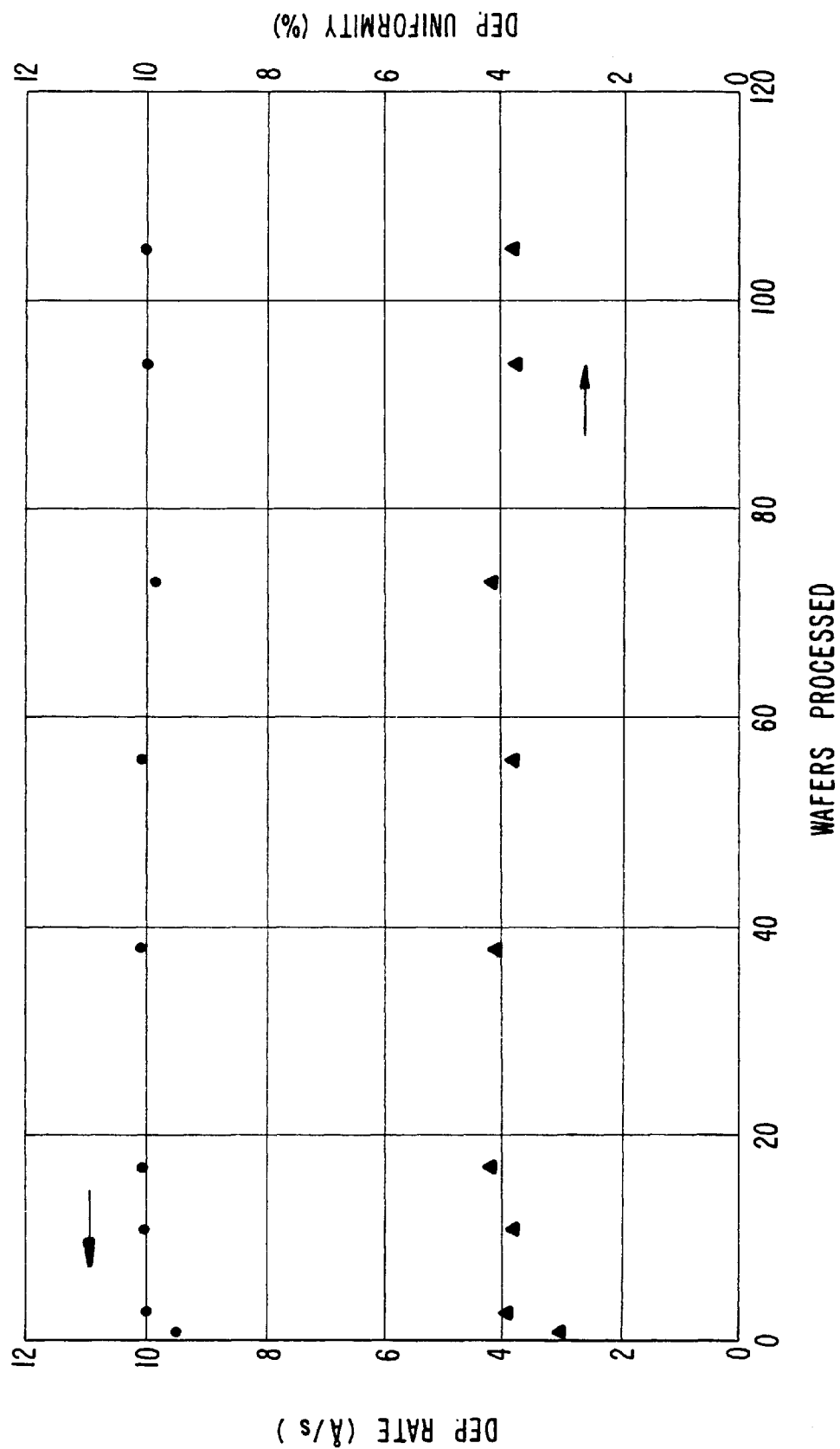
FIG. 7 is a graph showing the measurements of deposition rate (Å/minute) on the left axis and the deposition uniformity (%) on the right axis for a sampling of consecutive initially processed wafers, as an illustration of the advantages of the specific embodiment of the present invention.

FIG. 6 is a diagram showing measurements of the sheet resistance ($\Omega$/square) on the left axis and the sheet resistance standard deviation (%) on the right axis for a sampling of consecutive processed wafers, where the first of the consecutive wafers was processed immediately after a preventive maintenance cleaning and subsequent wafers were processed prior to the next preventive maintenance cleaning. In FIG. 6, sheet resistance measurements are indicated by points shown as circles, and sheet resistance standard deviations are indicated by points shown as triangles. As seen in FIG. 6, the sheet resistance for about the initial 120 wafers ranges between about 250 to 280 Ω/square after about the 5th wafer, and the sheet resistance standard deviation (for 1 σ) ranges between about 2 to 3% for most of the wafers after about the 5th wafer. FIG. 5 illustrates that the TiN film deposited using the above described process after being run on only about the 5th wafer meets sheet resistance specifications. Accordingly, the number of initial wafers that need to be discarded for not meeting specifications is greatly minimized compared to the prior art TDMAT processes where hundreds of the initial wafers were discarded as not meeting either resistance or uniformity specifications. To illustrate that only a minimal number of the initial wafers do not meet both resistance and uniformity specifications, the results of FIG. 6 should be considered in addition to the results shown in FIG. 7. FIG. 7 is a graph showing the measurements of deposition rate (Å/minute) on the left axis and the deposition uniformity (%) on the right axis for a sampling of consecutive processed wafers, where the first of the consecutive wafers was processed immediately after a preventive maintenance cleaning and subsequent wafers were processed prior to the next preventive maintenance cleaning. As seen in FIG. 7, the deposition rate for about the initial 120 wafers is about 10 Å/minute after only about the 5th wafer, and the deposition uniformity is about 4% after only about the 5th wafer. FIG. 7 illustrates that the deposition rate of the TiN film deposited using the above described process stabilizes to about 10 Å/minute with a 4% deposition uniformity after being run on only about the 5th wafer. Thus, the number of initial wafers (five wafers as shown in this example) that need to be discarded for not meeting uniformity specifications is greatly minimized compared to the prior art TDMAT processes where hundreds of the initial wafers were discarded as not meeting either uniformity or resistance specifications.

Figure 8:
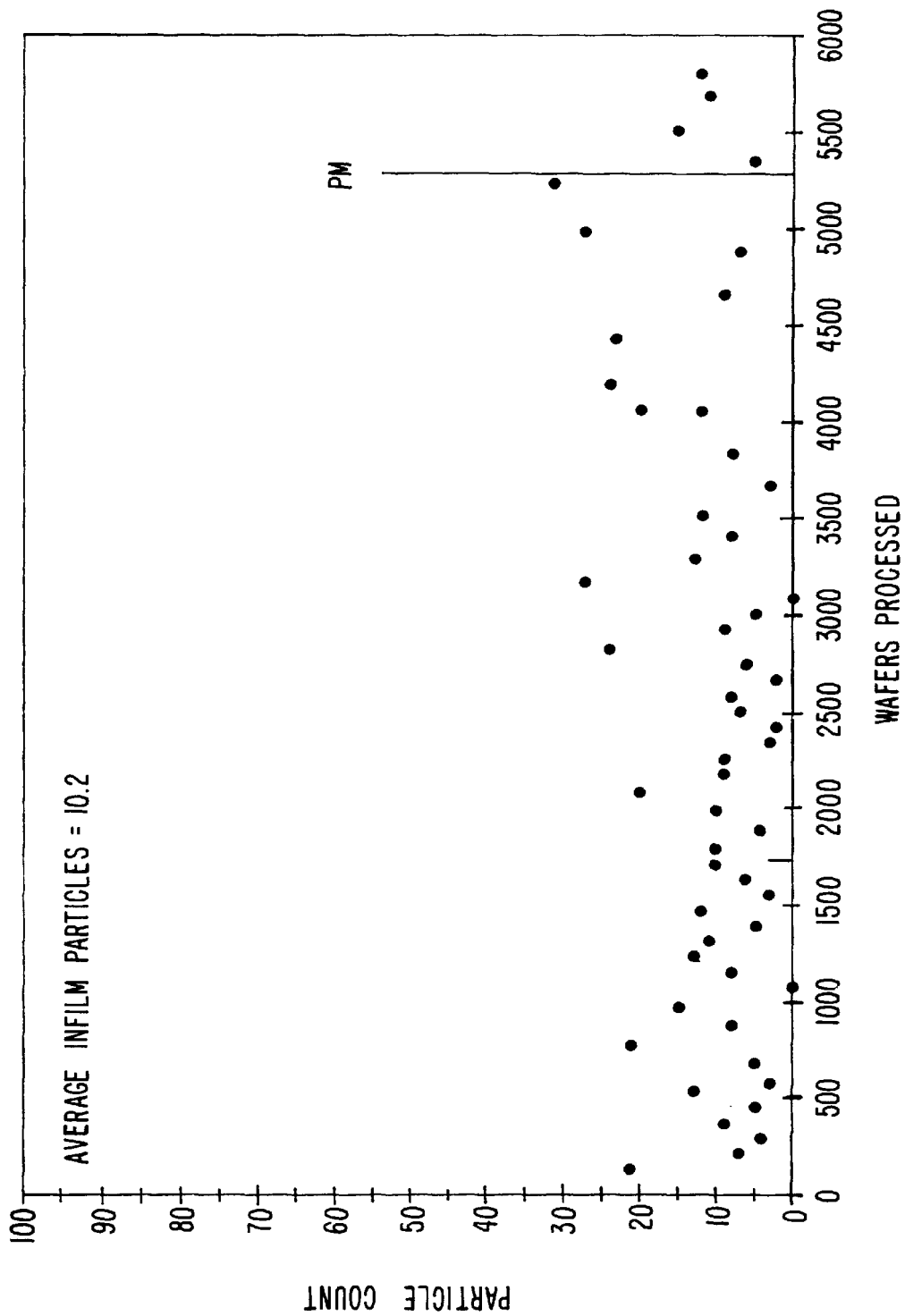
FIG. 8 is a diagram showing the measurements of particle count for the extended wafer run of FIG. 5, in accordance with a specific embodiment of the present invention.

FIG. 8 is a diagram showing the measurements of particle count for the extended wafer run of FIG. 5, according to a specific embodiment of the present invention. Performed with a 5-mm edge exclusion, the experimental results shown in FIG. 8 illustrate the number of particles having a diameter greater than or equal to 0.2 μm that were counted on a sampling of the wafers in the extended wafer run of FIG. 5. The particle count was less than 30 for most of the wafers in the extended run, with the average in-film particle count being about 10.2. FIG. 8 thus illustrates that the specific embodiment of the present invention provides good particle performance for an extended wafer run.

Figure 9:
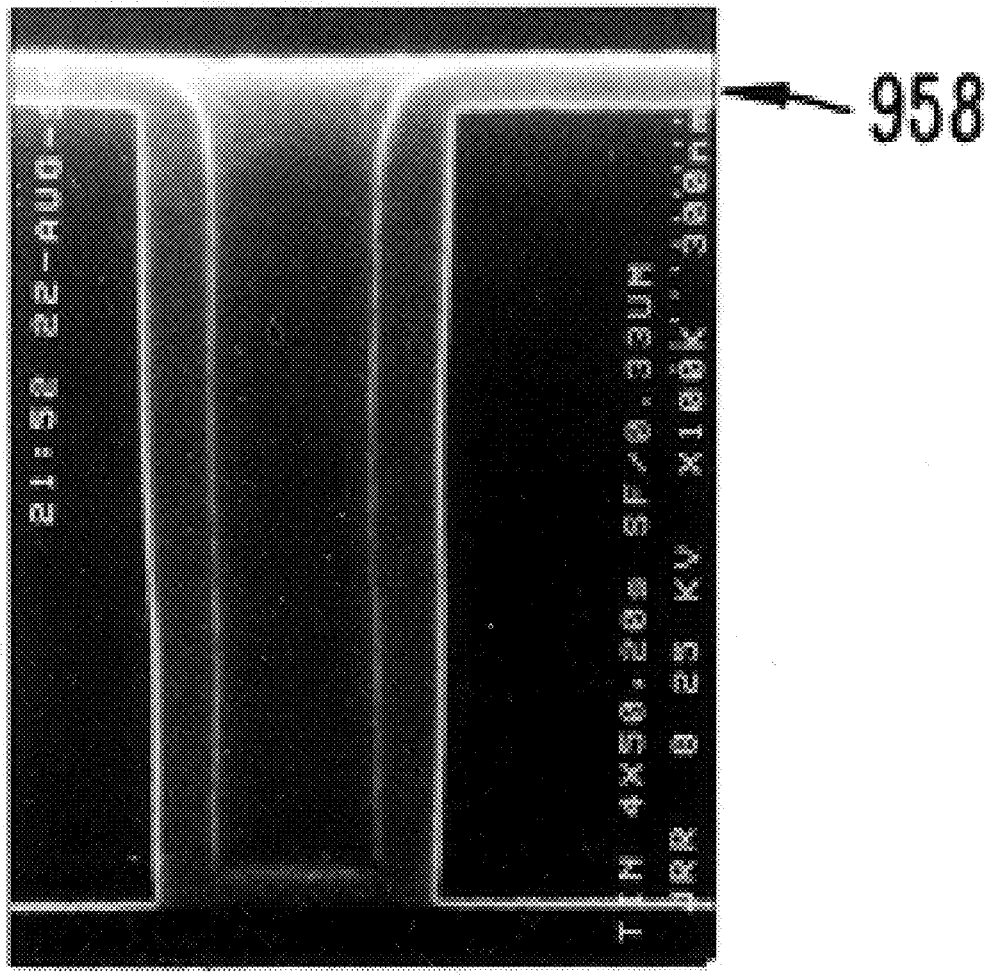
FIG. 9 is a scanning electron micrograph (SEM) of the deposited and treated titanium nitride film deposited in a gap, in accordance with the specific embodiment of the present invention discussed above for the exemplary process.

FIG. 9 is a scanning electron micrograph (SEM) of the titanium nitride film deposited and treated in accordance with the specific embodiment of the present invention discussed above for the exemplary process. FIG. 9 illustrates a titanium nitride film deposited (subsequent to a thin titanium deposition) in a gap having about 0.3 μm width and an aspect ratio of about 7:1. Having a thickness of about 90 Å, the titanium nitride film (indicated by 958 in FIG. 9) deposited in accordance with the specific embodiment has a greater than 70% step coverage for this type of geometry.

It is believed that performing the deposition process at a high heater temperature flowing selected gases, resulting in the lower effective wafer temperature, with a CVD system operating at a lowered heat exchange temperature results in a cleaner, more efficient process which greatly minimizes the amount of processed substrates which do not meet specifications. Similar benefits would seem likely to appear for other processes, besides the described titanium nitride process, where flow rates are increased using a higher heater temperature and a lower heat exchange temperature.

It is to be understood that the above description is intended to be illustrative and not restrictive. Many embodiments will be apparent to those of skill in the art upon reviewing the above description. By way of example, the inventions herein have been illustrated primarily with regard to a titanium nitride process recipe, but they are not so limited. For example, the film formed according to other embodiments may be a titanium silicide film, a titanium film, other metal film, doped film, dielectric film, or other film. It is also recognized that the invention is not limited to the specific dimensions described above for various specific embodiments. Also, materials besides those described above for specific embodiments may be used for various components of the chamber, such as the faceplate which may be made of nickel, graphite, or other materials. Additionally, various aspects of the present invention may also be used for other applications. Those skilled in the art will recognize other equivalent or alternative methods of depositing the layer while remaining within the scope of the claims of the present invention. The scope of the invention should, therefore, be determined not with reference to the above description, but should instead be determined with reference to the appended claims, along with the full scope of equivalents to which such claims are entitled.

What is claimed is:

1. A method of substrate processing comprising the steps of:

circulating a heat exchange medium through a passage in a chamber body of a vacuum chamber, said heat exchange medium having a heat exchange temperature of about 60° C. or less;

heating a heater pedestal having a surface for supporting said substrate to a heater temperature;

flowing at a flow rate a gas into said chamber to deposit a film on a substrate, said flow rate providing an effective temperature of said substrate lower than said heater temperature, wherein said film meets uniformity and resistance specifications after deposition onto a number of substrates, said number being less than twenty-five.

2. The method of claim 1 wherein said film comprises titanium nitride and said gas comprises vaporized TDMAT.

3. The method of claim 2 wherein said gas further comprises hydrogen ($H_2$) and helium.

4. The method of claim 3 wherein said vaporized TDMAT includes a helium delivery gas.

5. The method of claim 3 wherein said flow rate ranges from about 0.4–2 liters/minute.

6. The method of claim 3 wherein said flow rate is about 0.8 liters/minute.

7. The method of claim 2 wherein said heat exchange temperature is less than about 50° C.

8. The method of claim 2 wherein said heat exchange temperature is less than about 40° C.

9. The method of claim 3 wherein said heater temperature is greater than about 400° C.

10. The method of claim 9 wherein said heater temperature is about 450° C.

11. The method of claim 1 further comprising the step of:
providing a pre-coating of said film in the vacuum chamber prior to deposition onto said number of substrates.

12. The method of claim 2 wherein said number is less than 10.

13. The method of claim 3 wherein further comprising the step of plasma treating said film by flowing nitrogen ($N_2$) and hydrogen ($H_2$) at about 500 sccm and applying RF energy of about 350 kHz at about 750 watts after each deposition onto said number of substrates.

* * * * *